(12) United States Patent
Li et al.

(10) Patent No.: US 9,406,689 B2
(45) Date of Patent: Aug. 2, 2016

(54) LOGIC FINFET HIGH-K/CONDUCTIVE GATE EMBEDDED MULTIPLE TIME PROGRAMMABLE FLASH MEMORY

(71) Applicant: QUALCOMM Incorporated, San Diego, CA (US)

(72) Inventors: Xia Li, San Diego, CA (US); Bin Yang, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/044,725

(22) Filed: Oct. 2, 2013

(65) Prior Publication Data

US 2015/0035039 A1    Feb. 5, 2015

Related U.S. Application Data

(60) Provisional application No. 61/860,481, filed on Jul. 31, 2013.

(51) Int. Cl.

| H01L 21/336 | (2006.01) |
|---|---|
| H01L 27/115 | (2006.01) |
| H01L 29/788 | (2006.01) |
| H01L 27/12 | (2006.01) |
| H01L 21/84 | (2006.01) |
| H01L 29/66 | (2006.01) |
| H01L 29/78 | (2006.01) |
| H01L 27/088 | (2006.01) |

(52) U.S. Cl.
CPC ........ *H01L 27/11551* (2013.01); *H01L 21/845* (2013.01); *H01L 27/0886* (2013.01); *H01L 27/11517* (2013.01); *H01L 27/1211* (2013.01); *H01L 29/66795* (2013.01); *H01L 29/785* (2013.01); *H01L 29/788* (2013.01); *H01L 29/7881* (2013.01)

(58) Field of Classification Search
USPC .................................. 257/316–322
See application file for complete search history.

(56) References Cited

U.S. PATENT DOCUMENTS

| 7,005,697 B2 | 2/2006 | Batra et al. | |
| 7,329,580 B2 * | 2/2008 | Choi | H01L 21/84 257/E21.682 |

(Continued)

FOREIGN PATENT DOCUMENTS

| EP | 1909288 A1 | 4/2008 |
| EP | 2026378 A2 | 2/2009 |
| WO | 2007069180 A1 | 6/2007 |

OTHER PUBLICATIONS

International Search Report and Written Opinion—PCT/US2014/042142—ISA/EPO—Sep. 17, 2014.

*Primary Examiner* — Ali Naraghi
(74) *Attorney, Agent, or Firm* — Seyfarth Shaw LLP

(57) ABSTRACT

A method for fabricating a multiple time programmable (MTP) device includes forming fins of a first conducting type on a substrate of a second conducting type. The method further includes forming a floating gate dielectric to partially surround the fins. The method also includes forming a floating gate on the floating gate dielectric. The method also includes forming a coupling film on the floating gate and forming a coupling gate on the coupling film.

7 Claims, 18 Drawing Sheets

(56) References Cited

U.S. PATENT DOCUMENTS

| | | |
|---|---|---|
| 7,405,968 B2 | 7/2008 | Mokhlesi et al. |
| 8,068,370 B2 | 11/2011 | Lue |
| 8,325,530 B2 * | 12/2012 | Lue et al. .................. 365/185.18 |
| 8,334,560 B2 * | 12/2012 | Pan et al. ....................... 257/316 |
| 8,440,542 B2 | 5/2013 | Sekar et al. |
| 2006/0044915 A1 * | 3/2006 | Park .................. H01L 27/11526 365/222 |
| 2007/0090443 A1 * | 4/2007 | Choi ........................ H01L 21/84 257/314 |
| 2009/0184346 A1 | 7/2009 | Jain |
| 2012/0299098 A1 | 11/2012 | Liu |
| 2012/0313097 A1 * | 12/2012 | Forbes et al. .................... 257/57 |
| 2014/0191323 A1 * | 7/2014 | Bergendahl et al. ........... 257/368 |
| 2016/0104801 A1 * | 4/2016 | Zhu ................... H01L 29/66795 365/185.25 |

* cited by examiner

| Terminate | Operation | Read | Program | Erase |
|---|---|---|---|---|
| Word Line | Selected<br>Unselected | Vcc<br>0V | Vcc<br>0V | 0V<br>0V |
| Source Line | Selected<br>Unselected | 0V<br>0V | Vp1 (1~4V)<br>0V | 0V<br>0V |
| Control Gate/<br>Capacitor | Selected<br>Unselected | Vcc<br>0V | Vp2 (~8V)<br>0V | ~-8V<br>0V |
| Erase Gate/<br>Capacitor | Selected<br>Unselected | 0V<br>0V | 0V<br>0V | Ve (~8V)<br>0V |
| Bit Line | Selected<br>Unselected | Vef<br>Vef | <1V<br>Vcc | 0V<br>0V |

FIG. 16

LOGIC FINFET HIGH-K/CONDUCTIVE GATE EMBEDDED MULTIPLE TIME PROGRAMMABLE FLASH MEMORY

CROSS-REFERENCE TO RELATED APPLICATION

This application claims the benefit under 35 U.S.C. Section 119(e) of and commonly-assigned U.S. Provisional Patent Application No. 61/860,481, filed on Jul. 31, 2013, by X. Li et al., entitled "LOGIC FINFET HIGH-K/CONDUCTIVE GATE EMBEDDED MULTIPLE TIME PROGRAMMABLE FLASH MEMORY", the disclosure of which is expressly incorporated by reference herein in its entirety.

BACKGROUND

1. Field

Aspects of the present disclosure relate to semiconductor devices, and more particularly to a high-k/conductive gate embedded flash multiple time programmable (MTP) non-volatile memory.

2. Background

In semiconductor devices, memory is often used to configure the functions of logic blocks and the routing of interconnections between devices and circuits. For power and size considerations, programmable non-volatile memories (NVM), (e.g., multiple time programmable (MTP) non-volatile memories), may be used to allow for customization of circuit operation.

NVM MTP memories may be fabricated from complementary metal-oxide-semiconductor (CMOS) circuits using field-effect transistor (FET) components. Recently, different structures for the transistors in CMOS have been introduced, where the transistor is a "fin" shaped (3D) structure. These structures are often referred to as "FinFET" structures.

There are some associated problems with using FinFETs in CMOS non-volatile memory applications. FinFETs may use additional voltage to couple a floating gate structure to the fin. Because the upper portion of the fin area (the width of the fin times the length) is often small, an additional program (write) voltage is used to couple the gates together in series, which may negate the power savings realized in CMOS circuitry. Further, MOS diodes used for coupling, (e.g., for the floating gate of a memory cell), only bias in a positive direction. Positive-only biasing makes it difficult for negative voltages to be used to program ("write to") or erase to/from a floating gate memory cell.

SUMMARY

A method of fabricating a multiple time programmable (MTP) device in accordance with an aspect of the present disclosure includes forming fins of a first conducting type on a substrate of a second conducting type. The method further includes forming a floating gate dielectric to partially surround the fins. The method also includes forming a floating gate on the floating gate dielectric. The method also includes forming a coupling film on the floating gate. The method also includes forming a coupling gate on the coupling film.

A multiple time programmable (MTP) device in accordance with another aspect of the present disclosure includes a substrate. Such a device also has a fin having a first wall, a second wall, and a surface connecting the first wall and the second wall, the first wall and the second wall adjoining the substrate. Such a device also includes a floating gate dielectric having a first dielectric surface on the first wall of the fin and a second dielectric surface on the surface of the fin. Such a device also includes a floating gate on the floating gate dielectric. Such a device also includes a coupling film on the floating gate. A coupling gate is provided on the coupling film.

A multiple time programming (MTP) device in accordance with another aspect of the present disclosure includes means for conducting current. Such a device also includes means for storing charges that control the current in the conducting means. The device also includes means for controlling the charges stored on the storing means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 16 illustrates an operation control table in accordance with an aspect of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

One aspect of the present disclosure is directed to a process to fabricate a multiple time programmable (MTP) NVM cell for flash memory. The process includes forming a high-k gate dielectric film on n-wells or p-wells in a substrate, and then forming a conductive gate (gate first) or dummy poly gate (gate last) on the high-k gate dielectric film. The conductive gates and/or poly gate may be a floating gate. Afterwards, other process steps may occur, such as forming spacers on the conductive gates, forming source/drain regions in the n/p-wells, removing the dummy poly gate and filling the conductive gate for a second dummy poly gate last case. Other steps include forming contacts in the source/drain regions, and forming a cap layer on the gates and the contacts.

Figure 1:
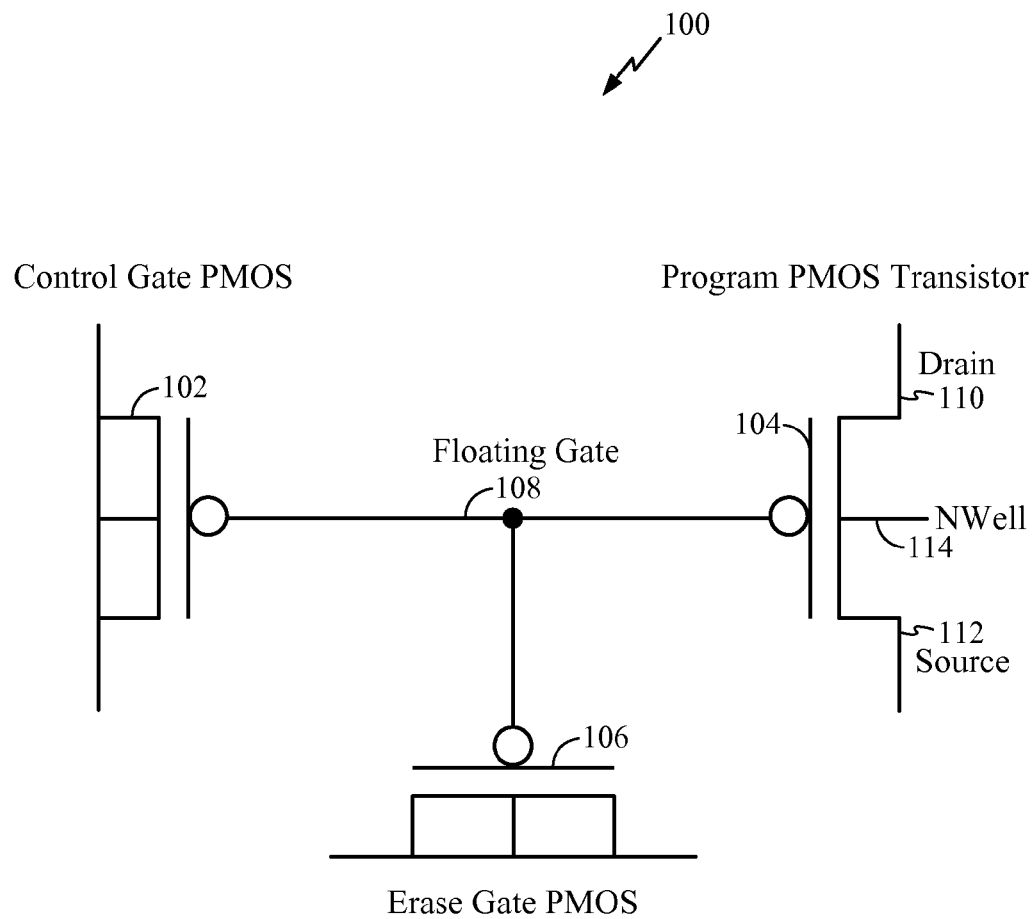
FIG. 1 illustrates a schematic of a CMOS floating gate nonvolatile memory (NVM) cell in an aspect of the present disclosure.

FIG. 1 illustrates a schematic of a PMOS FinFET floating gate NVM cell. Representatively, a memory cell 100 includes a control transistor 102 (also referred to as coupling gate 102), a program transistor 104, and, optionally, an erase transistor 106 (also referred to as an erase gate/capacitor 106). The coupling gate 102, the gate of the program transistor 104, and, optionally, the gate of the erase gate/capacitor 106 are coupled together at the floating gate 108. The drain 110, the source 112, and the well (which may be an n-doped well) 114 are shown for the program transistor 104. There can also be a word line access transistor in series (not shown). This would be a four PMOS transistor floating gate FinFET NVM cell. It also can be a four NMOS transistor floating gate FinFET NVM cell.

Figure 2:
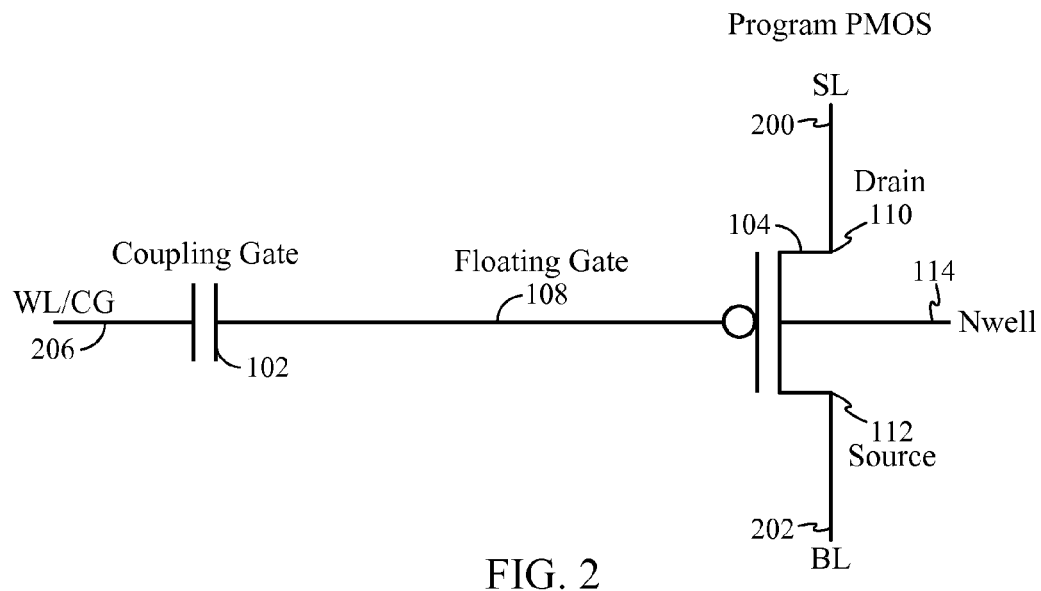
FIG. 2 illustrates a schematic of a CMOS floating gate NVM cell in another aspect of the present disclosure.

As shown in FIG. 2, in an aspect of the present disclosure, the coupling gate 102 is a plate capacitor. To program the program transistor 104, the source 112, which is coupled to a bit line (BL) 202, is brought to a low voltage, which may be ground. In addition, the drain 110, which is coupled to a source line (SL) 200, is brought to a higher voltage, which may be the operating voltage or the supply voltage (Vdd). To turn on the program transistor 104, the voltage across the coupling gate 102 is negative raised, for example, by applying a negative voltage to the word line (WL) or control gate (CG) 206. The word line/control gate 206 is the conduction path of the coupling gate 102. When the coupling gate 102 receives a negative bias, negative charge is induced on the coupling gate 102, inducing negative charge on the floating gate 108 of the program transistor 104. The floating gate 108 may use an n-type conductive gate for PMOS devices for improved data retention. This allows the channel in the program transistor 104 to turn on and conduct. A conducting program gate of the program transistor 104 indicates a particular logic level whereas a non-conducting program gate of the program transistor 104 indicates a different logic level with positive charge inside the floating gate 108. The program floating device can be an NMOS floating gate device. The floating gate 108 may use a p-type conductive gate for NMOS devices for improved data retention. FIG. 2 shows a one transistor floating gate NVM cell.

Figure 3:
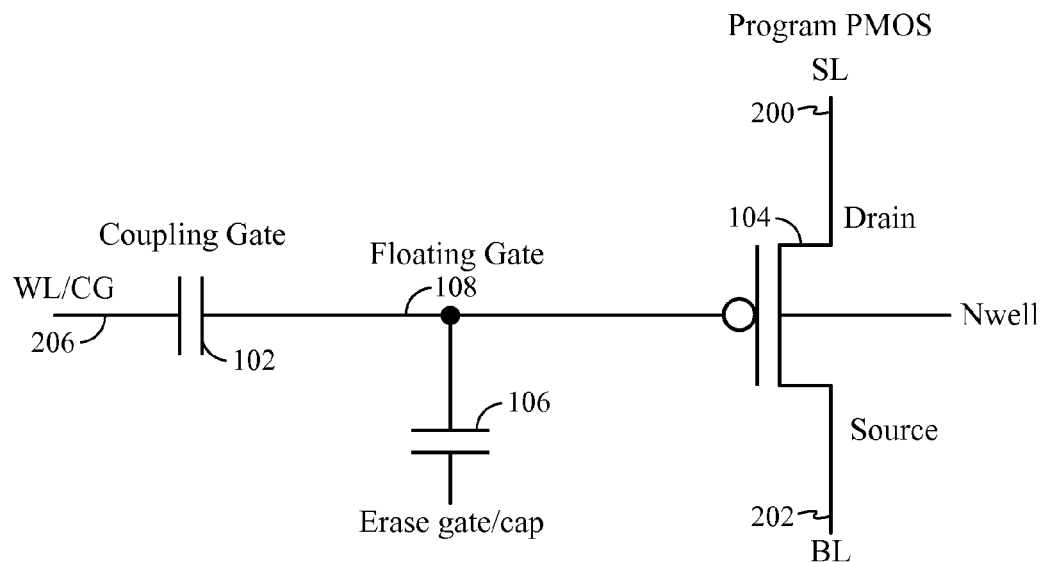
FIG. 3 illustrates a schematic of a CMOS floating gate NVM cell in another aspect of the present disclosure.

Another aspect of the present disclosure, shown in FIG. 3, includes the erase gate/capacitor 106 as part of the memory cell 100. When the erase gate/capacitor 106 is biased by voltage of the erase gate/capacitor 106, in optional conjunction with changing the voltage on the word line/control gate 206, the charge at the floating gate 108 is reduced such that the program transistor 104 no longer has enough electrical charge on the floating gate 108 to shut off current between the source line 200 and the bit line 202. The floating gate 108 may use an n-type conductive gate for PMOS devices for better data retention. This "erases" the program transistor 104. The program floating device can also be an NMOS floating gate device. The floating gate 108 may use a p-type conductive gate for NMOS devices for better data retention. The program floating device can also be an NMOS floating gate device. The floating gate 108 may use a p-type conductive gate for NMOS devices for improved data retention. FIG. 3 shows a two transistor floating gate NVM cell.

Figure 5:
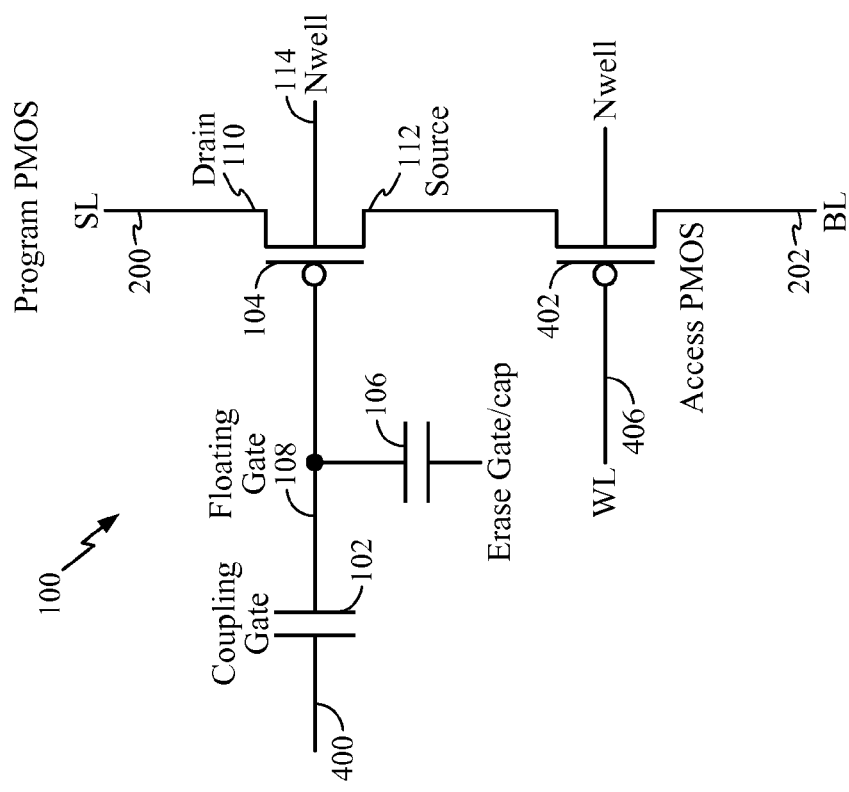
FIGS. 4 and 5 illustrate schematics of other aspects of CMOS floating gate NVM cells in accordance with the present disclosure.
Figure 4:
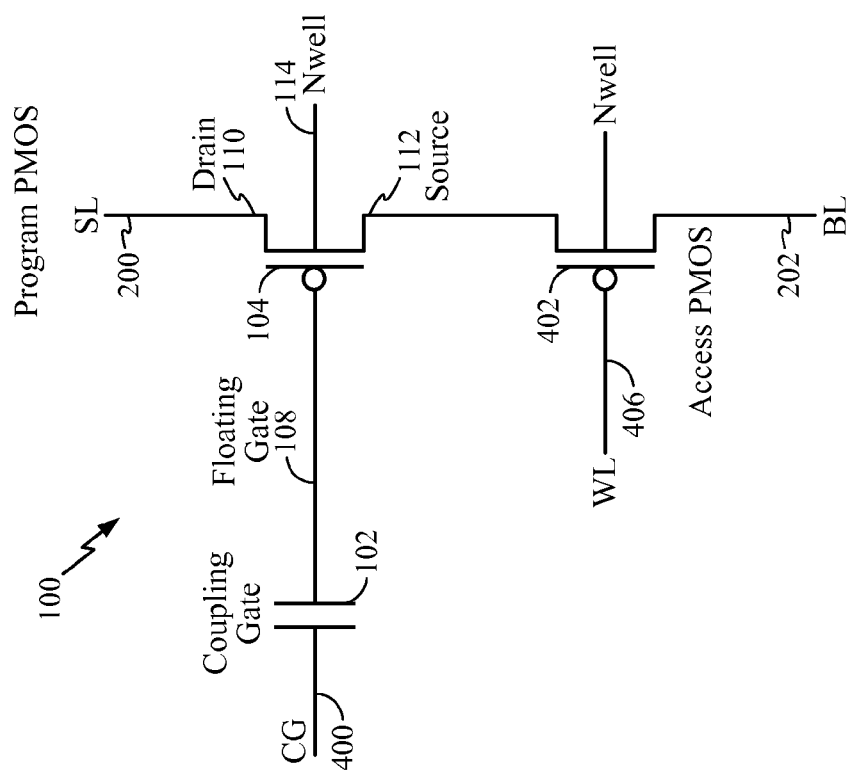

FIGS. 4 and 5 illustrate schematics of other aspects of PMOS floating gate NVM cells in accordance with the present disclosure.

As shown in FIG. 4, the control gate (CG) 400 may be separated from the word line gate 406 (as opposed to being a combined word line/control gate 206 as shown in FIG. 2) by including an access transistor 402 coupled to the source 112 of the program transistor 104. The bit line 202 is then coupled to the source of the access transistor 402, and the word line gate 406 is coupled to the gate of the access transistor 402. FIG. 4 shows a two transistor floating gate NVM cell.

As shown in FIG. 5, the schematic of FIG. 4 can include an erase gate/capacitor 106. FIG. 5 shows a four transistor floating gate NVM cell. The floating gate 108 may use an n-type conductive gate for PMOS devices for better data retention. The program floating device can also be an NMOS floating gate device. The floating gate 108 may use a p-type conductive gate for NMOS devices for better data retention.

Figure 6A:
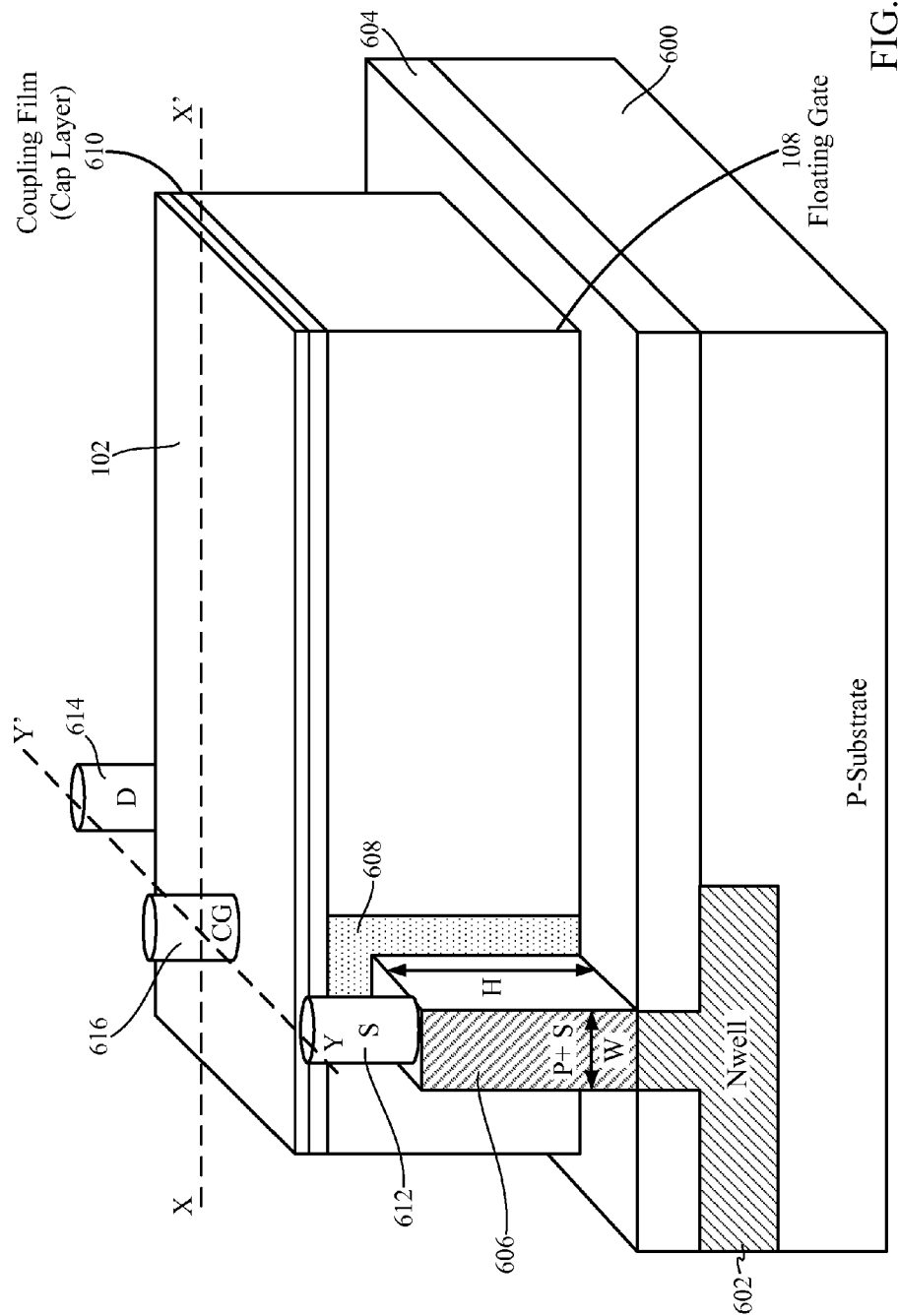
FIGS. 6A and 6B illustrate birds-eye views of a FinFET floating gate NVM transistor in accordance with various aspects of the present disclosure.

FIG. 6A illustrates a cutaway view of a FinFET floating gate transistor in accordance with an aspect of the present disclosure. Representatively, a substrate 600 supporting an n-well 602 is shown (for PMOS devices). An oxide layer 604, which may be a shallow trench isolation (STI) oxide layer 604, is coupled to the substrate 600 and a portion of the oxide layer 604 is opened to expose the n-well 602. A fin structure 606 with a width and a height is formed, and a gate oxide layer 608 is formed around the fin structure 606. The gate oxide layer 608 may be silicon oxide, or may be a dielectric or other material with a different dielectric constant (k) than silicon oxide, such as Aluminum Oxide, Hafnium Oxide, Hafnium Oxide Nitride, Zirconium Oxide, laminates and/or alloys of these materials. Other materials may be used without departing from the scope of the present disclosure.

A thickness-adjustable oxide may also be coupled to the gate oxide layer 608. Further, the gate oxide layer 608 may be a high-k dielectric material. A "high-k dielectric material" is a dielectric material with a dielectric constant k greater than the dielectric constant of silicon dioxide. For the same actual thickness, a high-k material will provide more capacitance per unit area than silicon dioxide. The high-k gate dielectric film may be made of, for example, Silicon Nitride (SiN), Silicon Carbide (SiC), Aluminum Oxide (Al2O3), Hafnium Oxide (HfOx), Hafnium Oxide Nitride, Zirconium Oxide, combinations or laminations of these or other materials, etc. These materials are used by standard logic FinFET processes and also used in FinFET floating gate devices in the memory cell 100. Use of high-K materials may also improve logic device performance for scaling technology, be used in a multiple time programmable memory, such as the memory cell 100.

As channel sizes in transistors become smaller, the thickness of the dielectric region in the gate oxide layer 608, and the thickness of a coupling film 610, is often reduced. The dielectric constant k of the gate oxide layer 608, along with the thickness of the gate oxide layer 608, has a heightened effect on the control of the floating gate 108 over the channel of the program transistor 104 (between the source 112 and the drain 110)(FIG. 1).

A high-k material allows for higher capacitance across the width of the material. Therefore, a high-k material can be used with a smaller channel size. The increased capacitive coupling accommodates the smaller channel size, allowing the gate to maintain the appropriate influence over the channel of the transistor. A larger actual thickness of a high-k material helps reduce or even minimize leakage current in the transistor.

A floating gate 108 is formed around the gate oxide layer 608. The floating gate 108 is conductive, and may be metal, polysilicon, or other materials. The coupling film 610, which is also referred to as a cap layer, is then placed on the floating gate 108. The coupling film 610 may be a dielectric, or other insulator as specified. The coupling gate 102 is then placed on the coupling film 610. A source contact 612, a drain contact 614, and a coupling gate contact 616 are then deposited on the source 112, the drain 110, and the coupling gate 102, respectively.

The fin structure 606 has a width W and a height H. As the voltages on the coupling gate contact 616 (which may be coupled to the word line/control gate 206), drain contact 614 (which is coupled to the source line 200), source contact 612 (which is coupled to the bit line 202) are changed, capacitive coupling occurs between the coupling gate 102 and the floating gate 108. The capacitive coupling allows conduction between the source contact 612 and the drain contact 614.

Figure 6B:
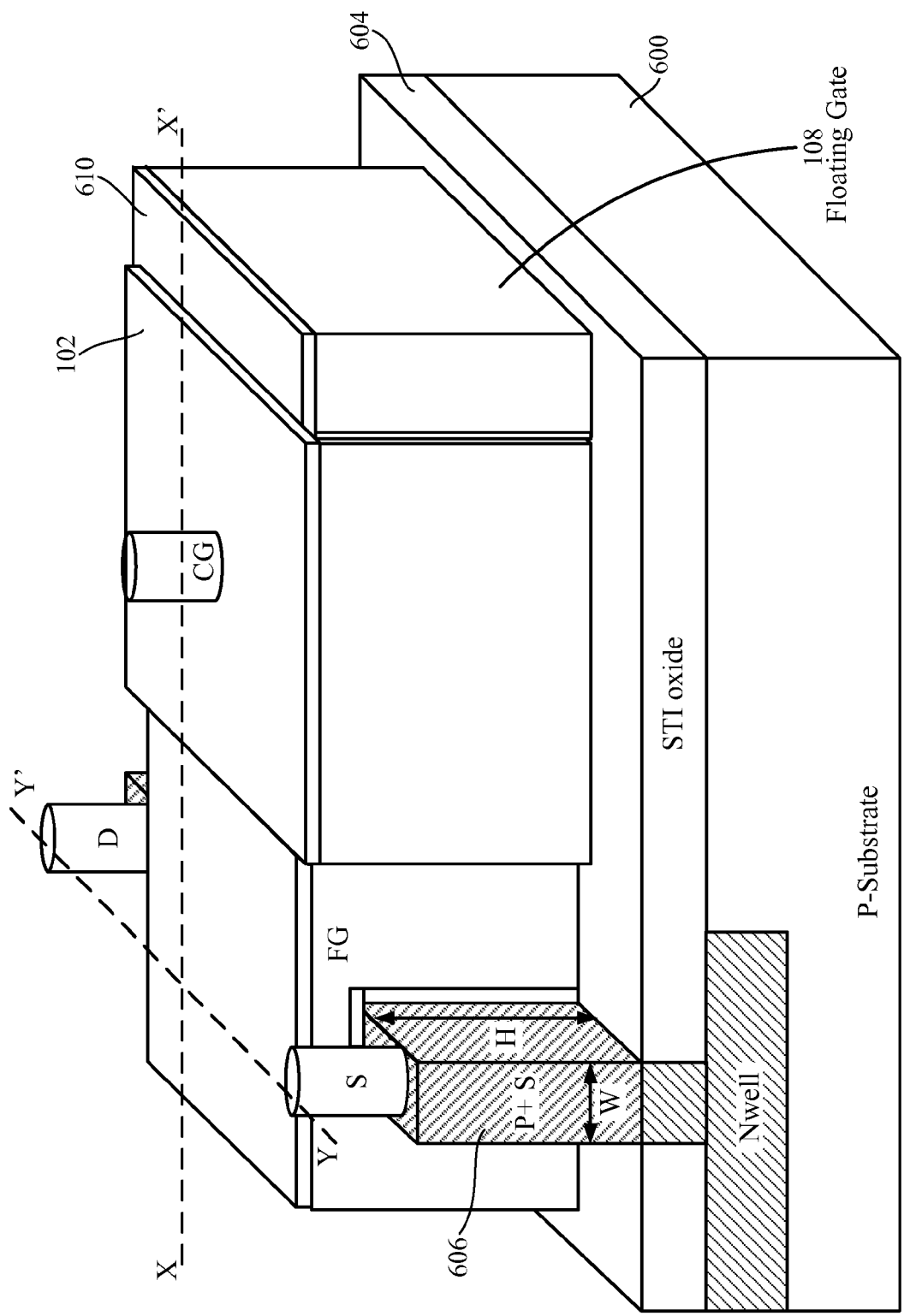

FIG. 6B illustrates a birds-eye view of a FinFET floating gate transistor in accordance with another aspect of the present disclosure. FIG. 6B illustrates that the coupling gate 102 may wrap around the floating gate 108 in an aspect of the present disclosure. The additional surface area between the coupling gate 102 and the floating gate 108 increases coupling ratio and decreases the amount of voltage specified to induce charge on the floating gate 108.

Figure 7A:
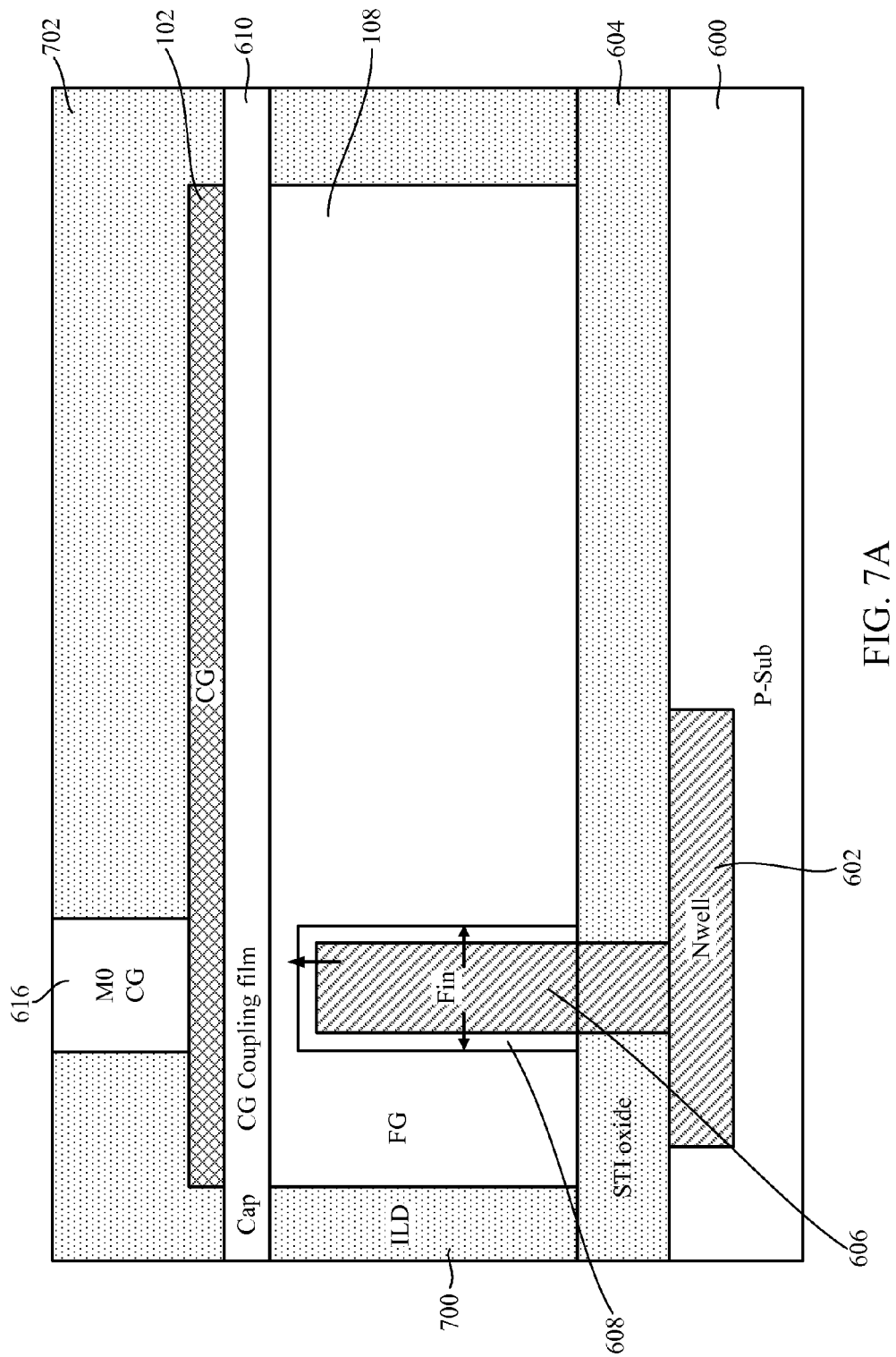
FIGS. 7A and 7B illustrate cutaway views of the structures shown in FIGS. 6A and 6B, respectively.

FIG. 7A illustrates a cutaway of the structure shown in FIG. 6A. Representatively, the gate oxide layer 608 is shown surrounding the fin structure 606, and dielectric layer 700, which may be an inter-layer dielectric (ILD) layer, is shown. Another layer 702, which may be a dielectric layer, insulating layer, or interconnection layer is also shown on the coupling gate 102.

Figure 7B:
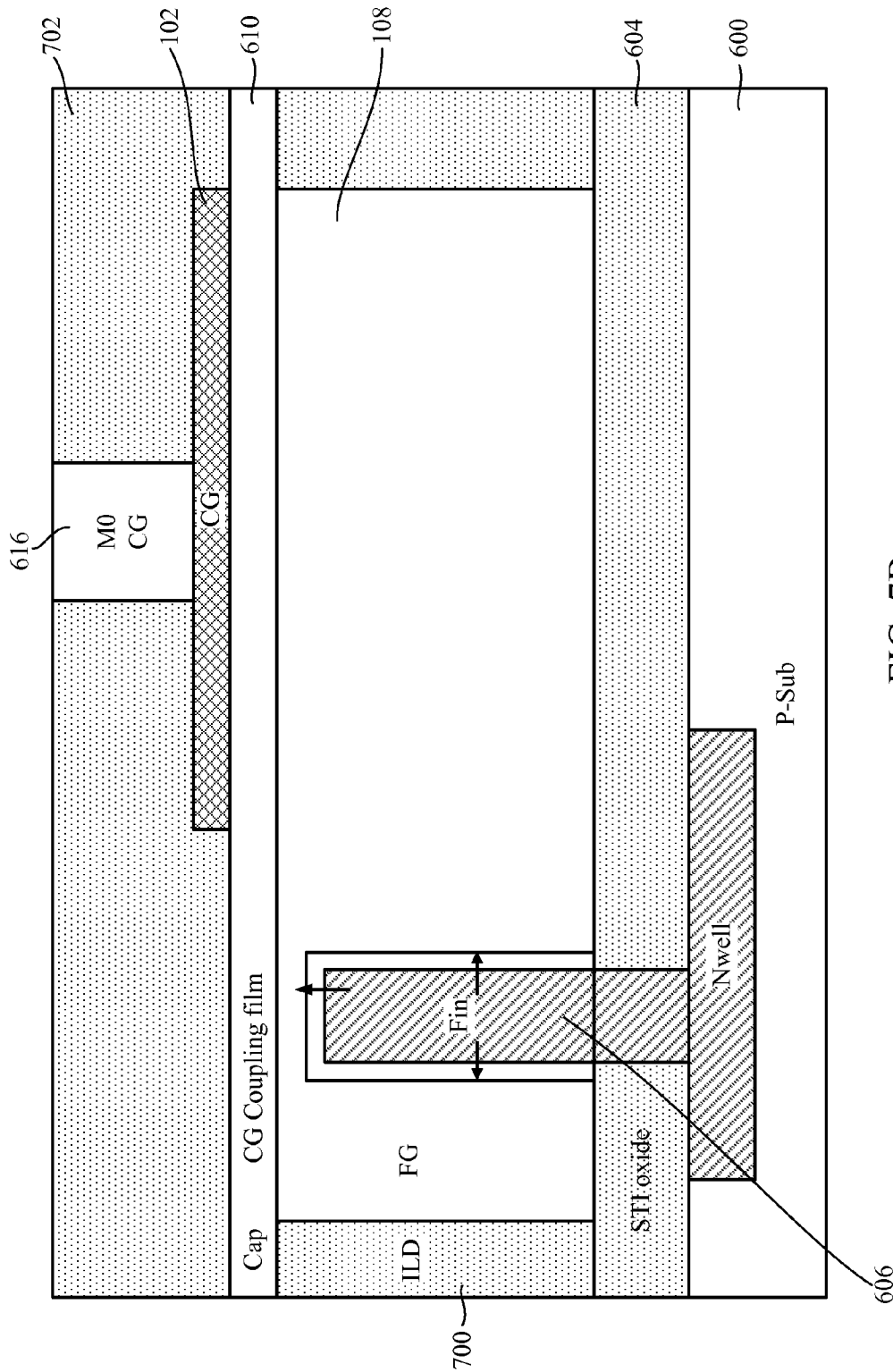

FIG. 7B illustrates a cutaway view of a FinFET floating gate transistor as shown in FIG. 6B. In this configuration, the offset nature of the coupling gate 102 with respect to the fin structure 606 illustrates that the channel between the source 112 and the drain 110 is controllable with the coupling gate 102. Control of the channel between the source 112 and the drain 110 is possible even when the coupling gate 102 is not in line with the fin structure 606. The coupling gate 102 generates charge on the floating gate 108 that controls the channel between the source 112 and the drain 110.

Figure 8:
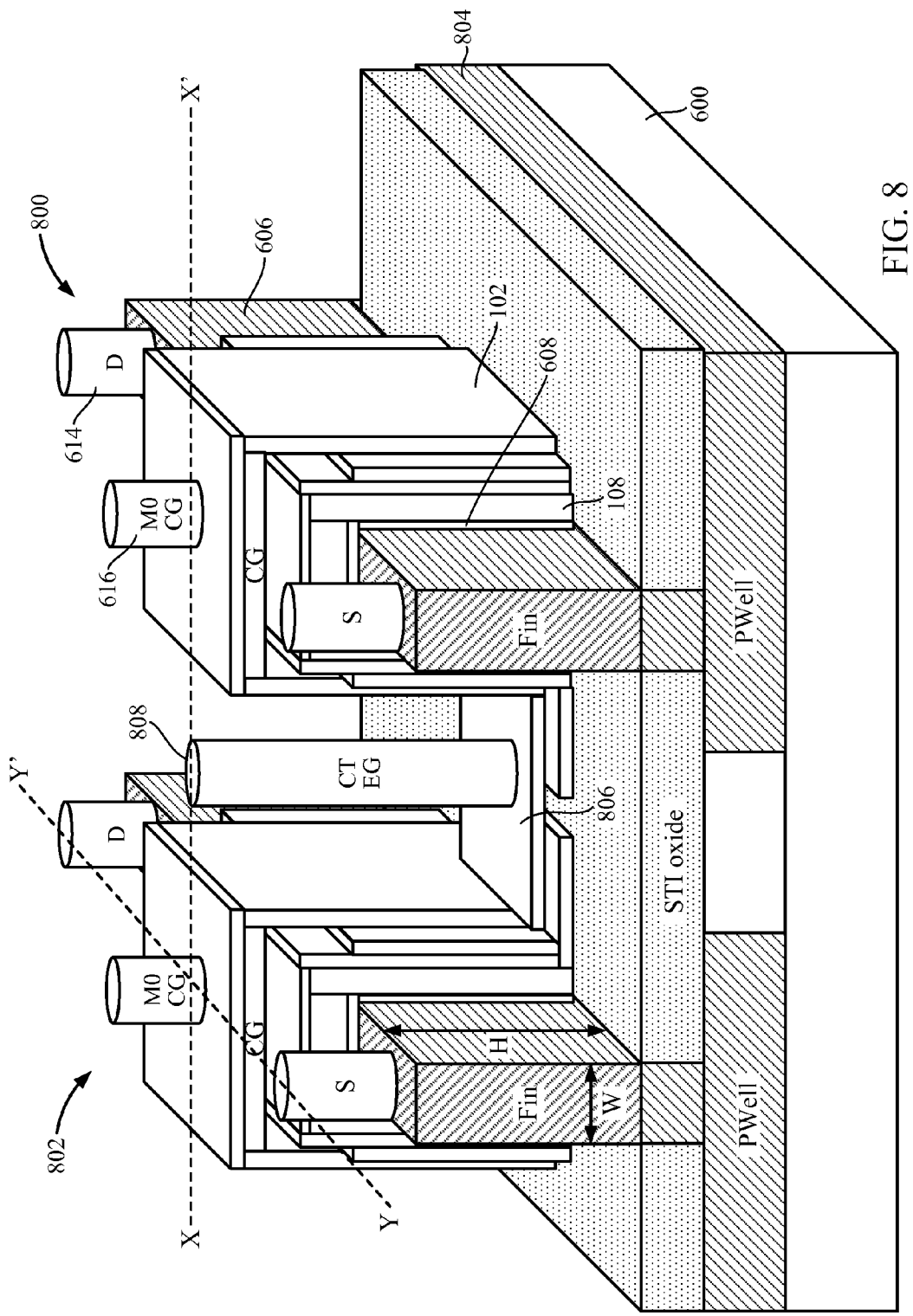
FIG. 8 illustrates a birds-eye view of FinFET floating gate NVM transistors including an erase gate structure in accordance with an aspect of the present disclosure.

FIG. 8 illustrates a cutaway view of another FinFET floating gate transistor including an erase capacitor structure in accordance with an aspect of the present disclosure. Representatively, floating gate transistors 800 and 802 are illustrated. Similar to the structure shown in FIG. 6, the substrate 600 is shown, with a p-well 804 (for NMOS devices). An n-well 602 similar to that shown in FIG. 6 may be used without departing from the scope of the present disclosure. A fin structure 606 is shown, with the floating gate 108 and the gate oxide layer 608. The coupling gate 102 and coupling gate contact 616, which is part of "metal layer 0," is shown.

An erase capacitor oxide 806 and erase capacitor contact 808 are also shown in between the floating gate transistors 800 and 802. In this configuration, the floating gate transistors 800 and 802 are FinFET versions of the program transistor 104, and the erase capacitor oxide 806 is an example of the erase gate/capacitor 106. Nevertheless, other configurations of the program transistor 104, which may be a CMOS transistor without a FinFET structure, and other configurations of the erase gate/capacitor 106, are envisioned to be within the scope of the present disclosure.

Figure 9:
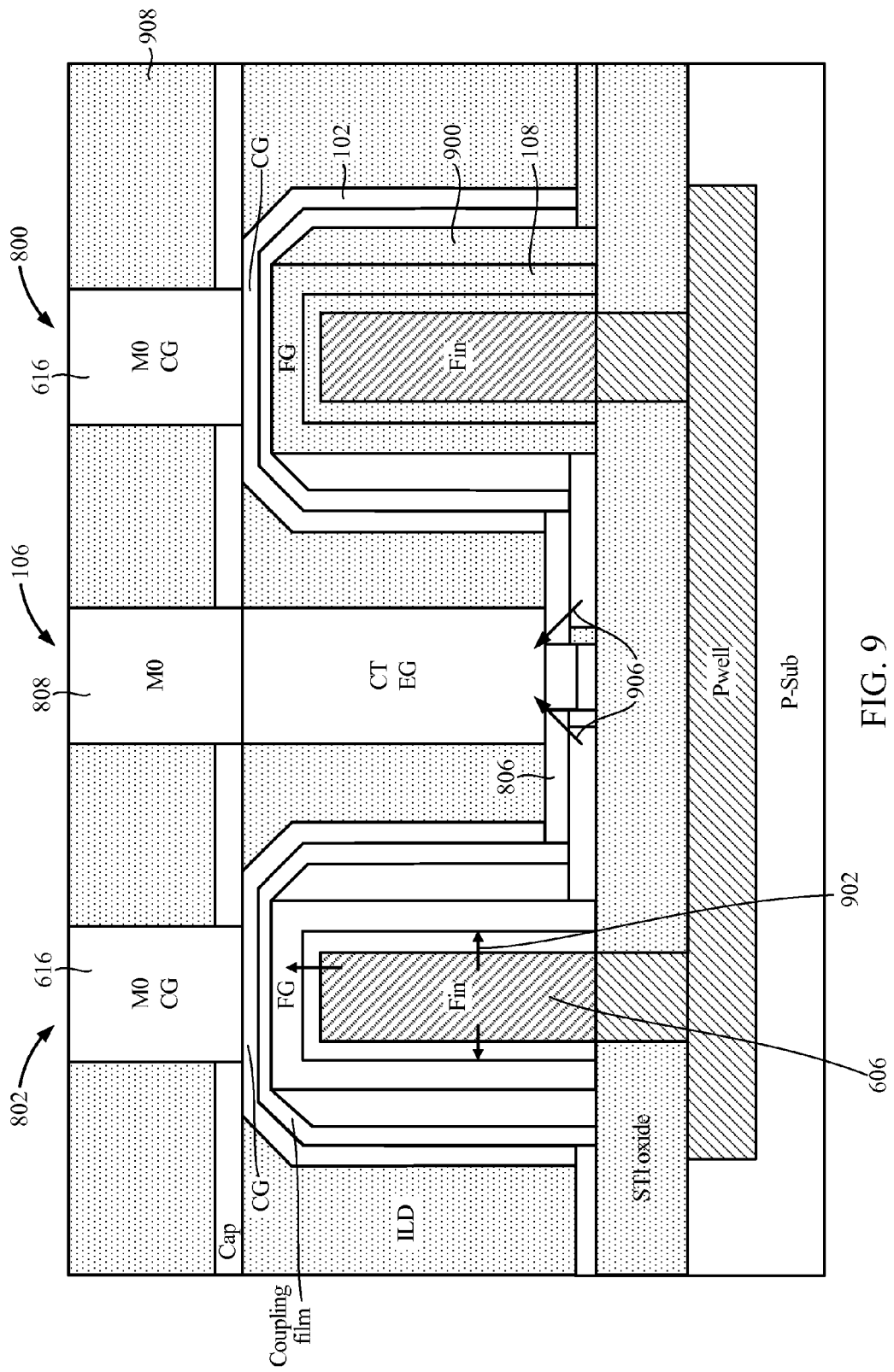
FIGS. 9 and 10 illustrate cutaway views of a FinFET NVM structure in an aspect of the present disclosure.

FIG. 9 illustrates a cutaway view of a FinFET structure in an aspect of the present disclosure. In particular, as shown in FIG. 9, the coupling gate 102 and the coupling gate contact 616 for the floating gate transistors 800 and 802 are shown. A spacer layer 900 is shown to provide an optionally different capacitive coupling between the sides of the coupling gate 102 and the sides of the floating gate 108. To program, read, and erase the floating gate transistors 800 and 802, voltages on the coupling gate 102 (which is coupled to the coupling gate contact 616), the word line/control gate 206, the bit line 202, the source line 200 (as shown in FIG. 2), and the erase gate/capacitor 106 (which is coupled to the erase capacitor contact 808) are selectively controlled to store or remove charge on the floating gate 108.

For example, and not by way of limitation, to program the floating gate transistor 802, the word line/control gate 206 is brought to a high voltage, which may be the supply voltage Vcc. This puts charge carriers into the fin structure 606 from an NMOS access word line (e.g., the word line/control gate 206). The source line is brought to a programming voltage, which may be between 1 and 4 volts. The control gate (CG) 400 (or the coupling gate contact 616) coupled to the coupling gate 102 is brought to a programming voltage, which may be approximately 4~10 volts. The erase capacitor contact 808 is brought to a programming voltage, which may be similar to the voltage on the source line 200. These voltages allow for current to flow through the floating gate transistor 802, and hot electron injection allows for charge to inject into the floating gate 108. The electric charge injection direction 902 between the fin structure 606 and the floating gate 108 is shown. Once the floating gate 108 is charged, the voltages can be selectively removed and the charge is stored on the floating gate 108.

Figure 10:
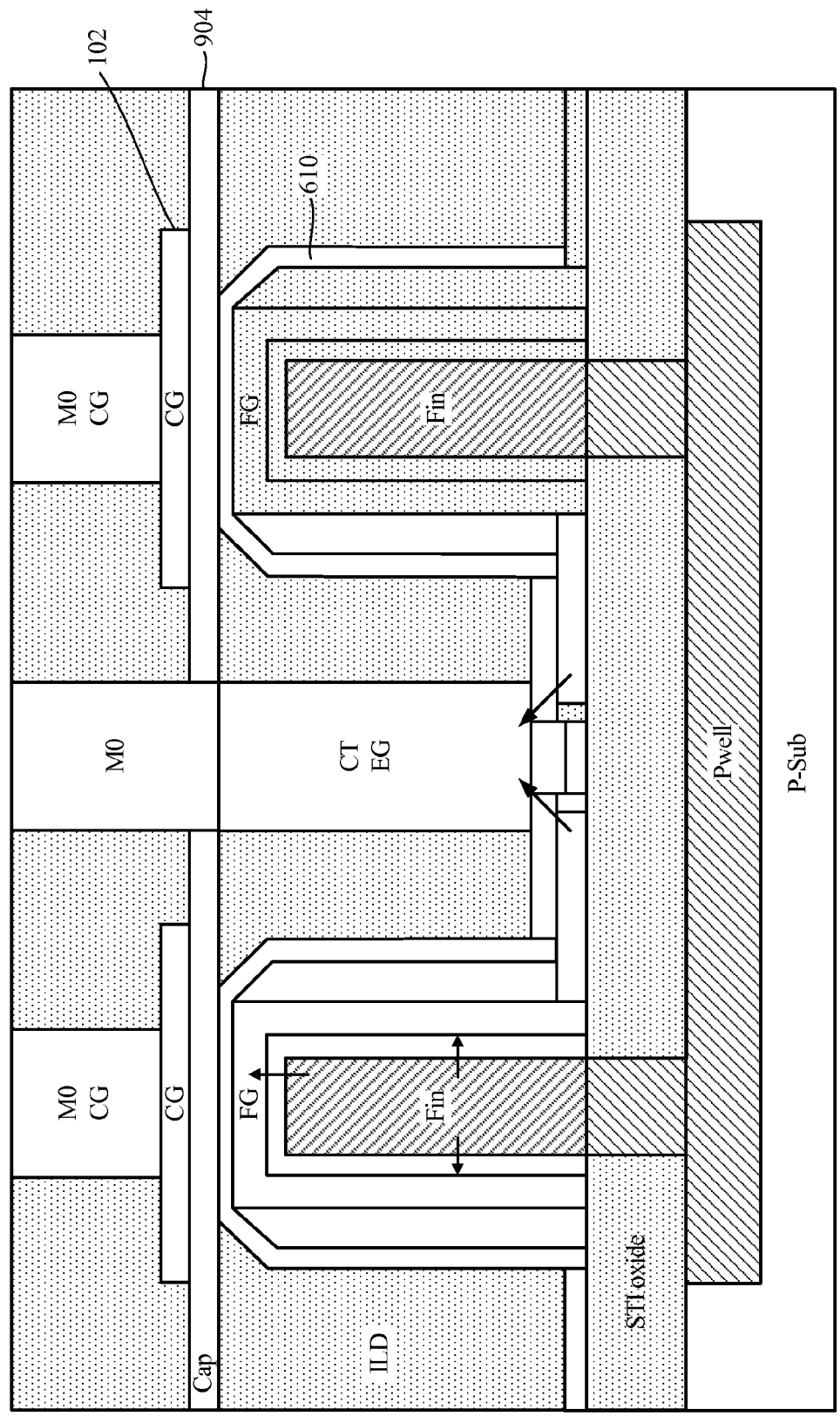

To erase a floating gate transistor 802 that is programmed, the erase capacitor contact 808 is brought to an erase voltage, which may be approximately 6 to 10 volts. The word line/control gate 206, the source line 200, the bit line 202, and the control gate/capacitor 400 are all brought to a low voltage, which may be zero volts. This difference in voltage potentials allows for Fowler-Nordheim (FN) tunneling of the charge carriers stored on the floating gate 108 to migrate across the erase capacitor oxide 806 to the erase capacitor contact 808. The FN path 906 for erasure of the floating gate transistor 802 is shown. Similar actions occur for writing to and erasing from the floating gate transistor 800. An additional layer 908 of dielectric or other material may be applied to planarize or otherwise seal the structure if specified, such that other manufacturing processes may be performed on the structure shown in FIG. 9. FIG. 10 illustrates that the cap layer 904 may reside between the coupling gate 102 and the coupling film 610. The cap layer 904 and the coupling film 610 may be dielectrics or other insulators as specified.

Figure 11:
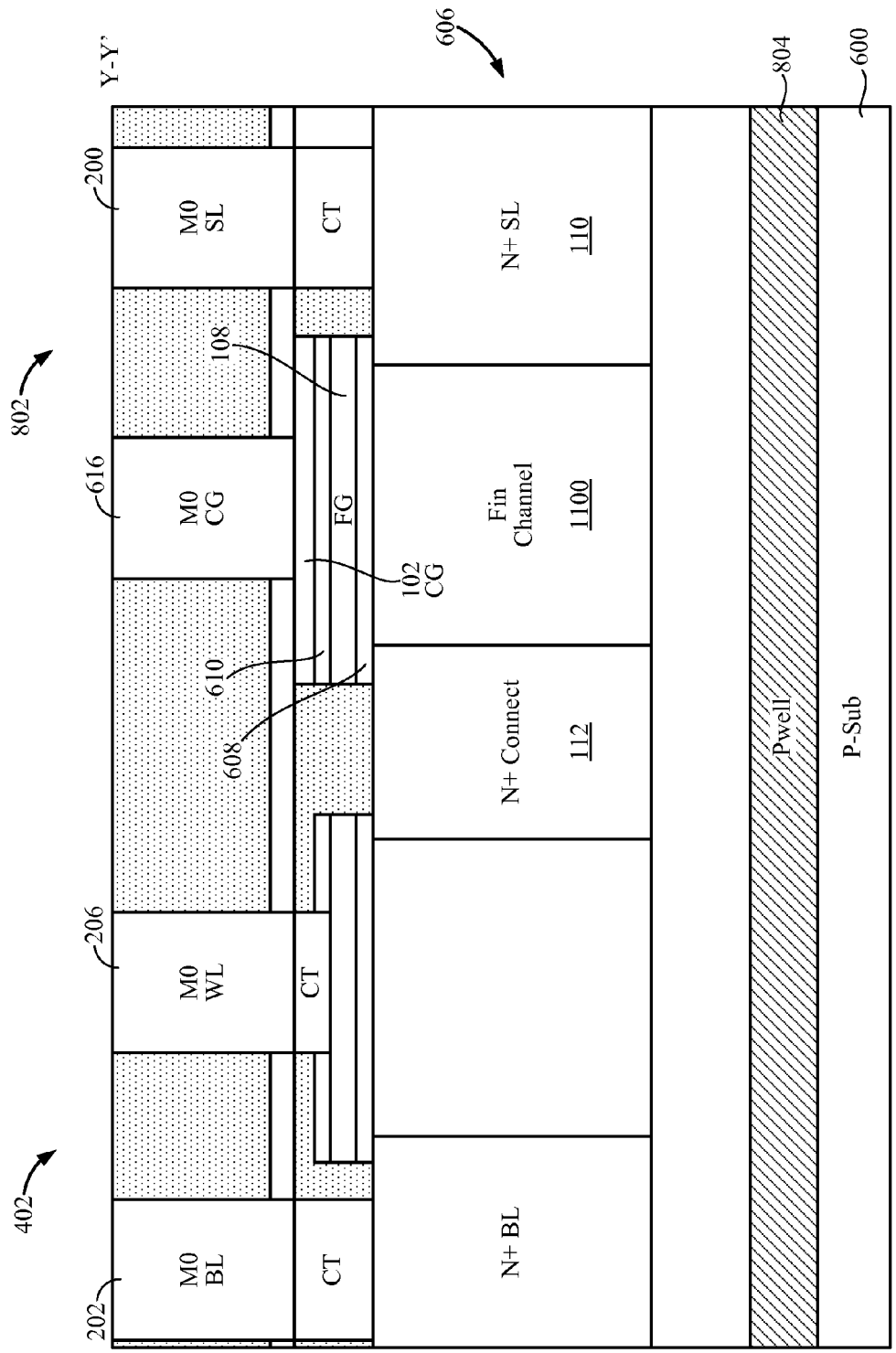
FIG. 11 illustrates a cutaway view of a transistor in accordance with an aspect of the present disclosure.

FIG. 11 illustrates a cutaway view of an NMOS floating gate and word line access transistors in accordance with an aspect of the present disclosure. When the structure of FIG. 8 is cutaway along the Y-Y' line, the view of FIG. 11 is seen. The substrate 600 and p-well 804 are shown, and the fin structure 606 shows a fin channel 1100 between the drain 110 and the source 112. As voltage is applied to the coupling gate contact 616, electric fields are generated in the fin channel 1100. Depending on the voltages present on the source line 200, the bit line 202, and the word line/control gate 206, current will flow between the source 112 and the drain 110. The cutaway view of FIG. 11 includes the access transistor 402, as the word line/control gate 206 and the coupling gate contact 616 are separated.

Figure 12:
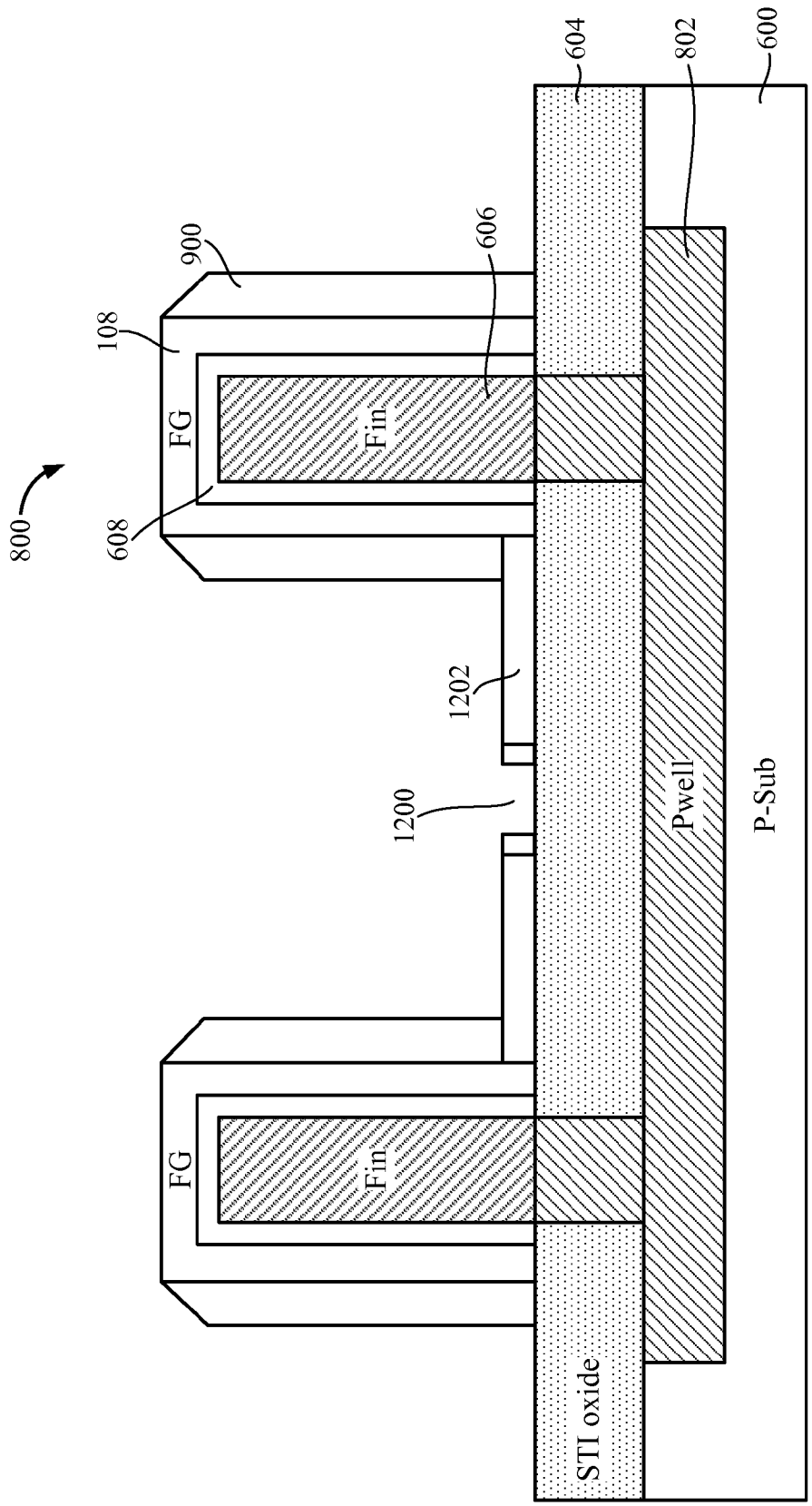
FIGS. 12 through 15 illustrate a process construction flow of transistors in accordance with an aspect of the present disclosure.

FIGS. 12 through 15 illustrate a process construction flow of transistors in accordance with an aspect of the present disclosure. FIG. 12 illustrates initial steps of depositing layers on the fin structure 606. The gate oxide layer 608, which may be a high-k dielectric material, is coupled to the fin structure 606, and the floating gate 108. An opening 1200 is made near the floating gate transistor 800, and a layer 1202 of material, which may be a section of the floating gate material is deposited. The spacer layer 900 is also deposited and etched or otherwise manipulated to conform the spacer layer 900 around the fin structure 606.

Figure 13:
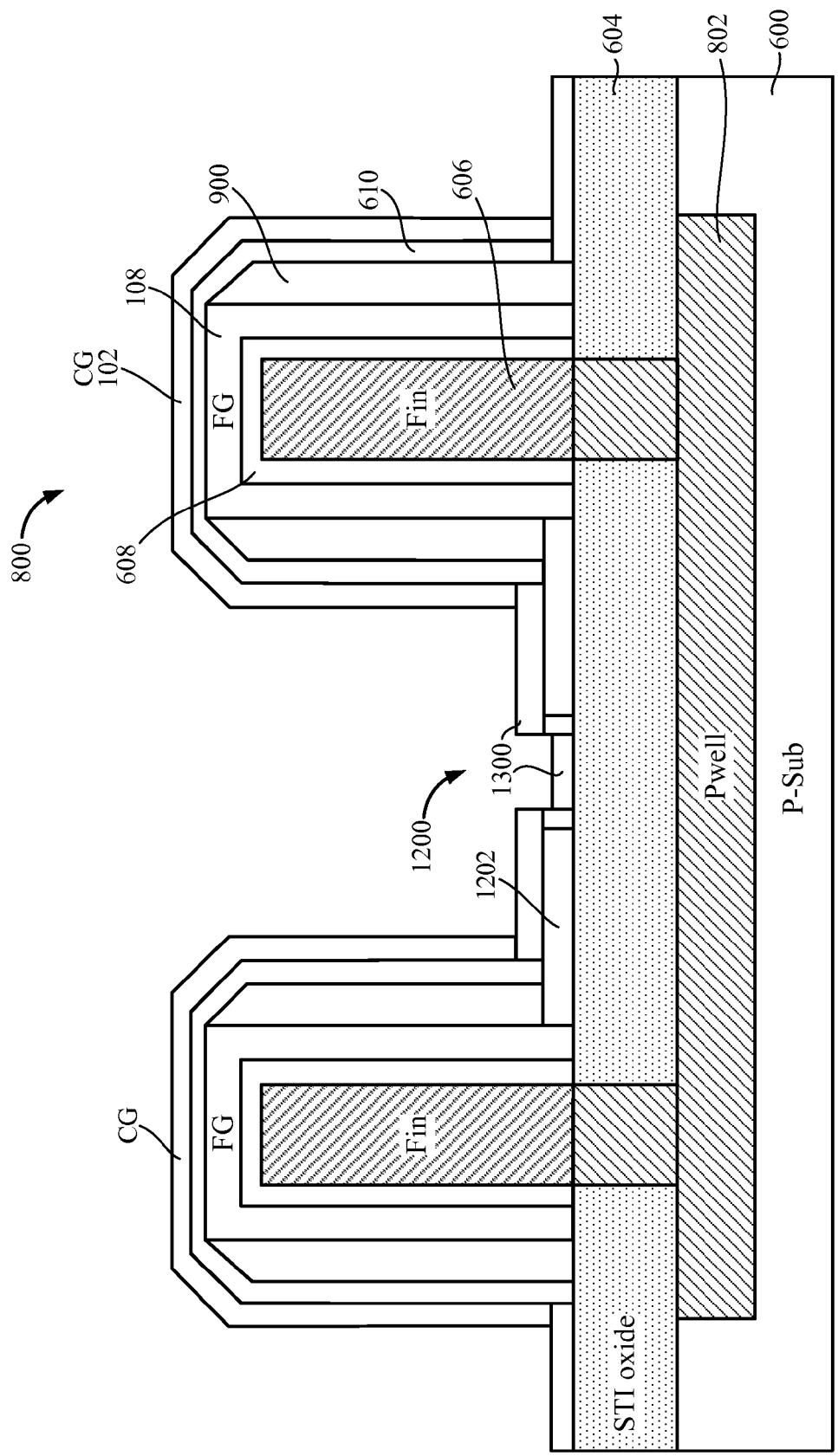

FIG. 13 illustrates addition of the coupling film 610, and the coupling gate 102, to the floating gate transistor 800. Because the material used for the coupling gate 102 is often conductive, a layer 1300 of this material, or other material, is deposited on the layer 1202 and in the opening 1200 for the erase contact.

Figure 14:
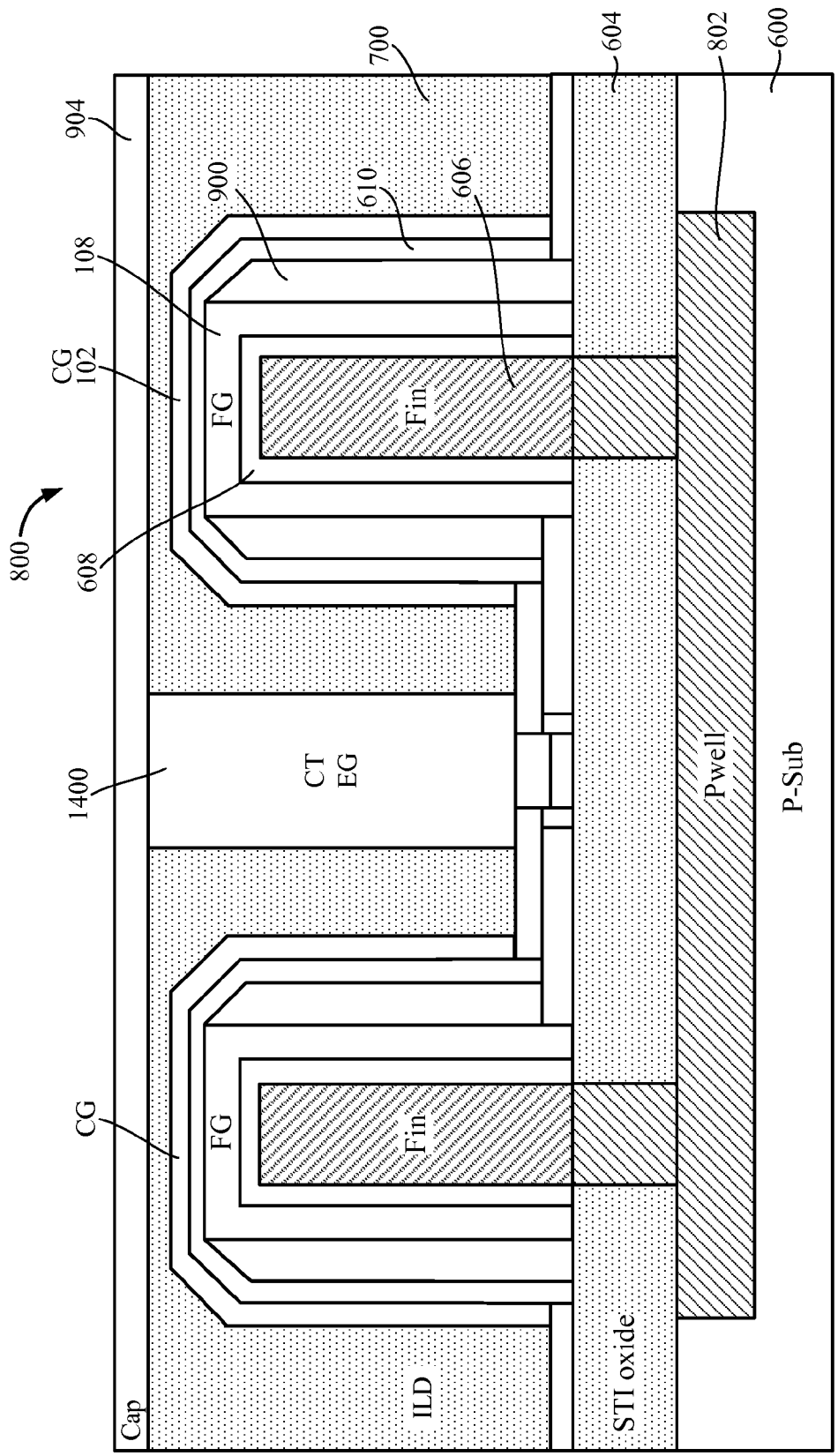

FIG. 14 shows the erase connection 1400 and the cap layer 904, with the dielectric layer 700 as a planarizing and/or isolation material such that the cap layer 904 is substantially planar and electrical contacts are isolated from each other as specified. The planarization allows for additional processing of the floating gate transistor 800.

Figure 15:
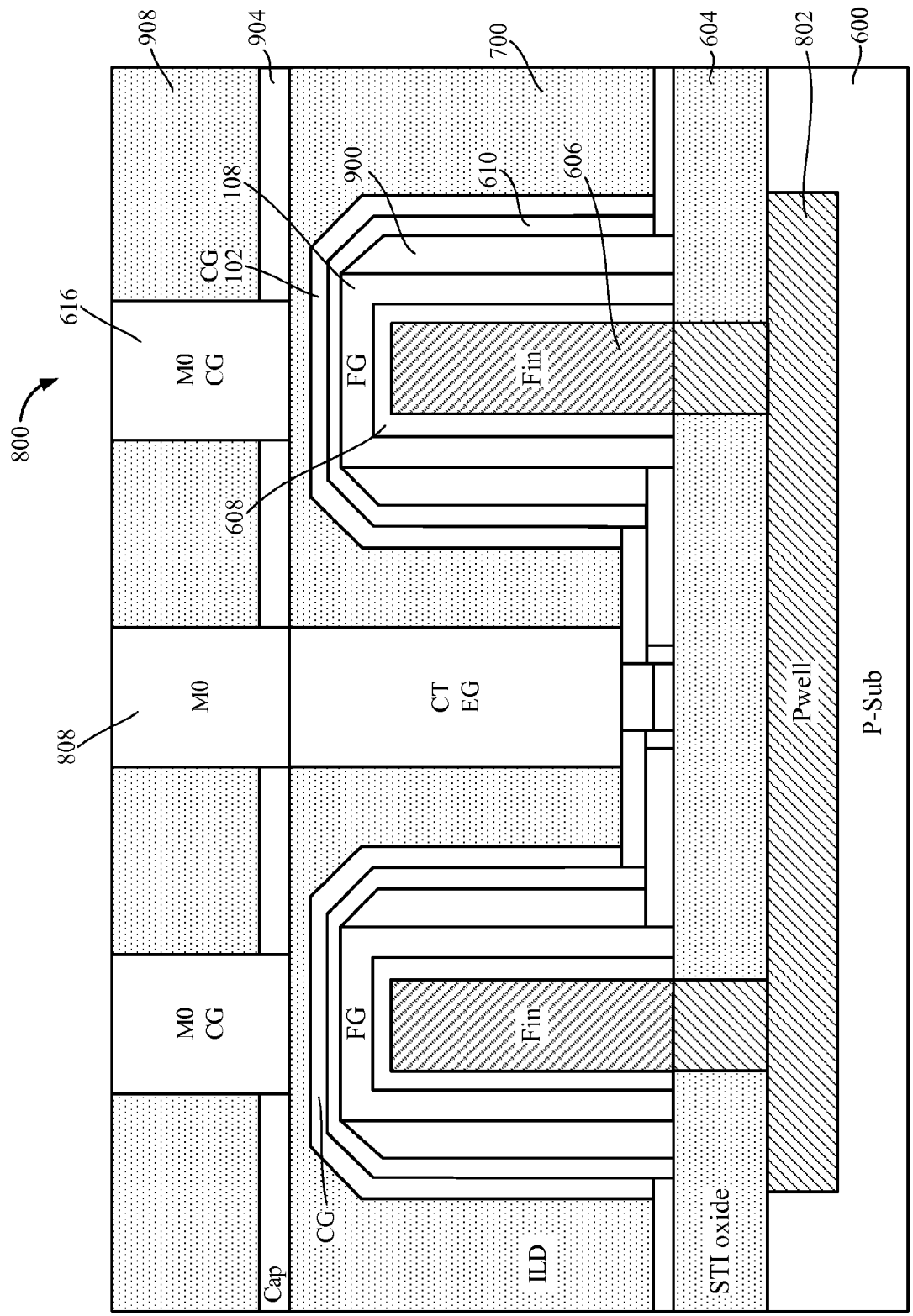

FIG. 15 illustrates addition of the coupling gate contact 616 and the erase capacitor contact 808. Additionally the layer 908 may be added, again for planarization and/or isolation of the contacts as specified. Additional layers, such as interconnections, vias, or other electronic circuitry may be added to the floating gate transistor 800 as specified.

FIG. 16 illustrates an operation control table in accordance with an aspect of the present disclosure. To program a particular transistor, voltages are set for certain operations 1600. The word line/control gate 206, the source line 200, the control gate/capacitor 400, erase gate/capacitor 106, and the bit line 202 are controlled based on the selected operation 1600. A read operation 1602, a programming operation 1604, and an erase operation 1606 may be performed. Voltages that may be applied to the lines are shown for when a given transistor is selected or unselected for the operations used in NVM cells, including MTP memory cells of the present disclosure.

Figure 17:
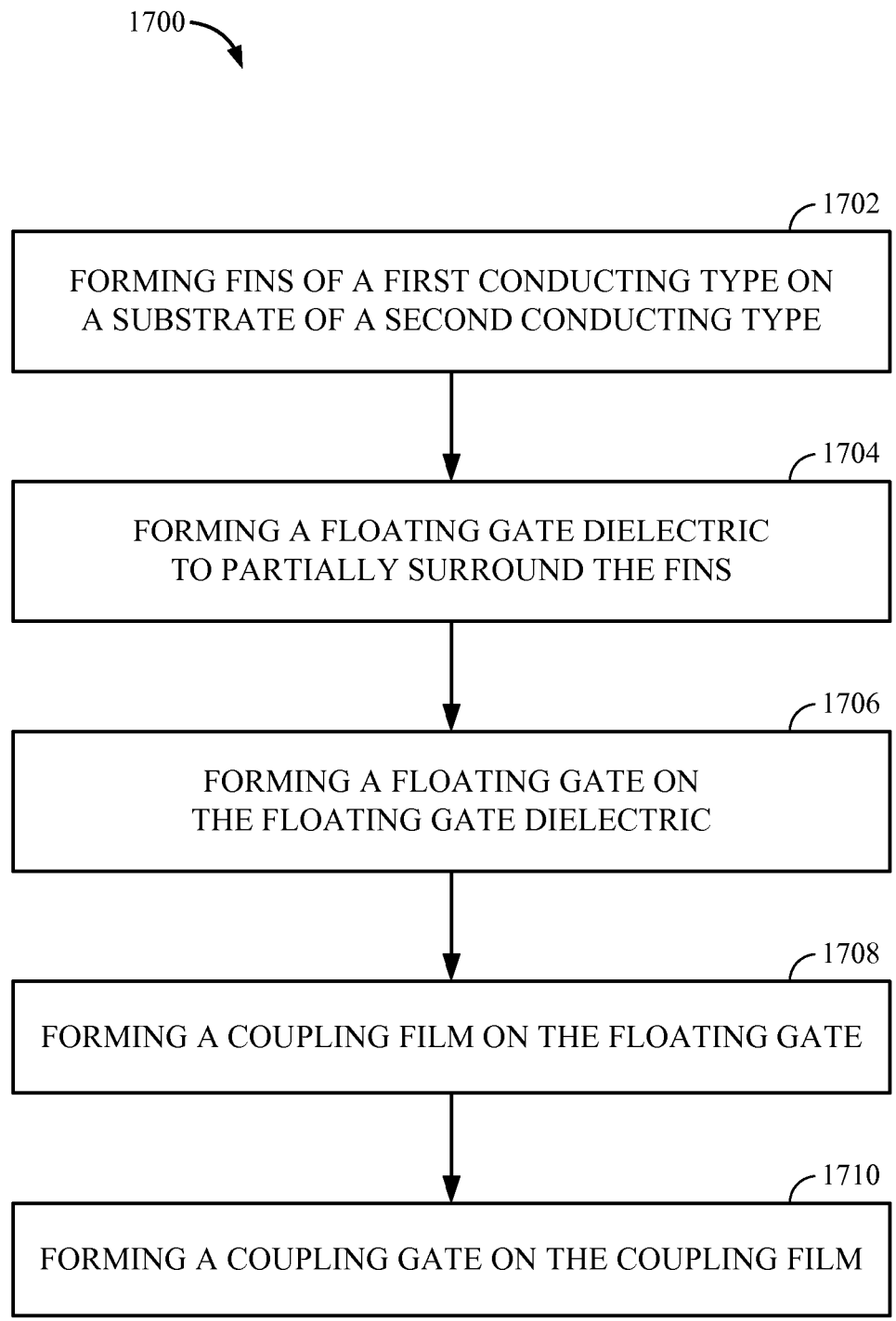
FIG. 17 illustrates a process flow in accordance with an aspect of the present disclosure.

FIG. 17 illustrates a process flow in accordance with an aspect of the present disclosure. Representatively, a flow chart 1700 illustrates a method of fabricating a multiple time programmable (MTP) NVM device. At block 1702, fins of a first conducting type are formed on a substrate of a second conducting type, as shown, for example, in FIG. 6. At block 1704, a floating gate dielectric is formed to partially surround the fins.

At block 1706, a floating gate is formed on the floating gate dielectric. At block 1708, a coupling film is formed on the floating gate. At block 1710, a coupling gate is formed on the coupling film.

Aspects of the present disclosure provides advantages over the related art by using a high-k/metal gate process to form an floating gate type eFlash MTP cell. Further, one aspect of the present disclosure allows the use of FinFET structures within an MTP cell. The structures, according to one aspect of the present disclosure, use similar processing as related devices. This aspect of present disclosure allows for a thickness tunable coupling oxide/high-k film, which may reduce the erase voltage used and improve data retention in the MTP cell. The control voltage of coupling gate 102 on the floating gate 108 can be positive or negative, whereas the related art used a positive voltage on the floating gate 108.

Aspects of the present disclosure also allow for additional coupling of the FinFET structure by "wrapping" the floating gate 108 and the coupling gate 102 around the fin structure 606 as shown in FIG. 15. This increased coupling allows for lower programming (write) voltages in the FinFET structure of this aspect of the present disclosure. Again, the control voltage of coupling gate 102 on the floating gate 108 can be positive or negative in this aspect of the present disclosure, eliminating the positive-only control of the related art.

In one configuration, a multiple time programmable (MTP) device includes a means for conducting current. In one aspect of the disclosure, the current conducting means may be the fin structure 606, the source 112 and the drain 110 and/or other structures configured to perform the transistor functions recited by the current conducting means. In this configuration, the device also includes means for storing charges. In one aspect, the storing means may be the floating gate 108 and/or other structures configured to perform the transistor functions recited by the current controlling means. The device also includes means for controlling logic states. The controlling means can be the coupling gate 102 and/or other structures configured to perform the functions recited by the charge inducing means. In another aspect, the aforementioned means may be any module or any apparatus configured to perform the functions recited by the aforementioned means.

Figure 18:
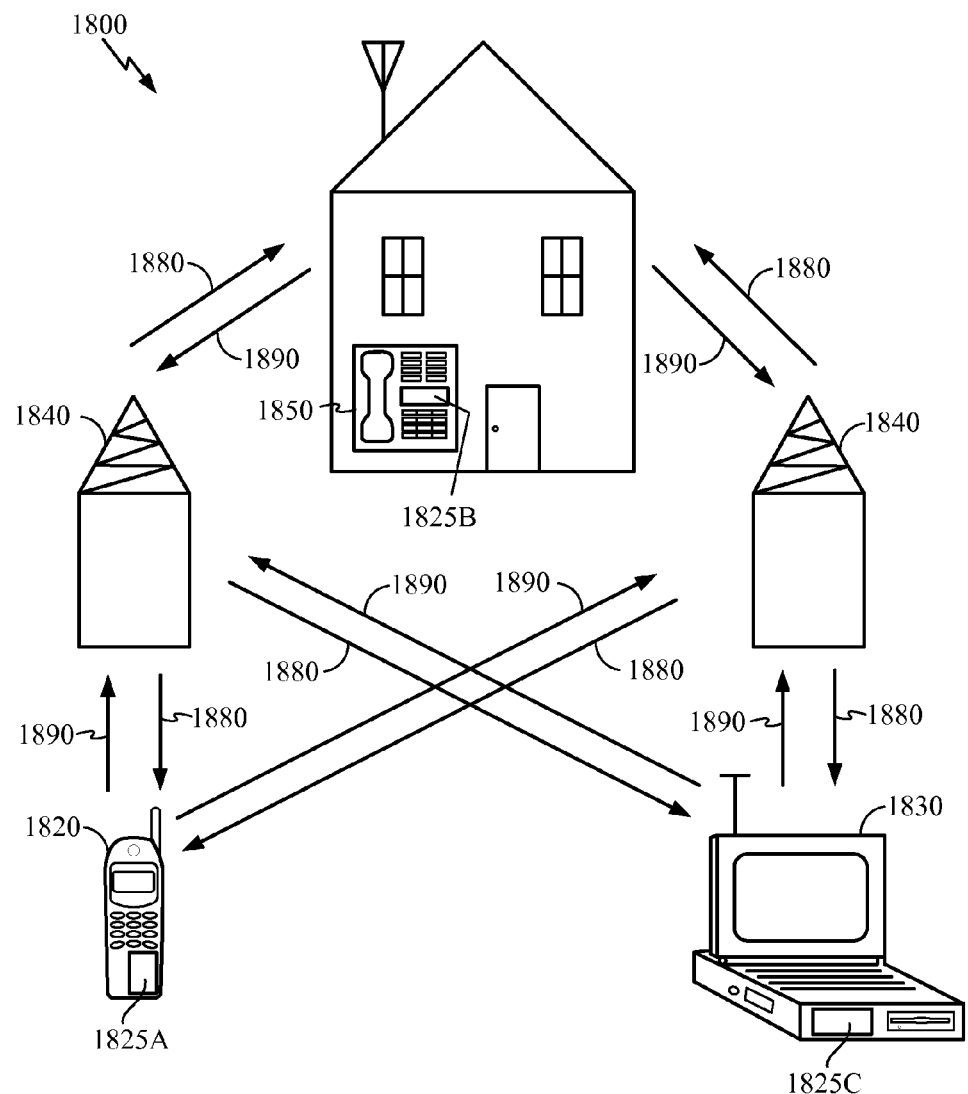
FIG. 18 is a block diagram showing an exemplary wireless communication system in which an aspect of the disclosure may be advantageously employed.

FIG. 18 is a block diagram showing an exemplary wireless communication system 1800 in which an aspect of the disclosure may be advantageously employed. For purposes of illustration, FIG. 18 shows three remote units 1820, 1830, and 1850 and two base stations 1840. It will be recognized that wireless communication systems may have many more remote units and base stations. Remote units 1820, 1830, and 1850 include IC devices 1825A, 1825C, and 1825B that include the floating gate transistors 800 and 802 or other disclosed structures in the present disclosure. It will be recognized that other devices may also include the disclosed devices, such as the base stations, switching devices, and network equipment. FIG. 18 shows forward link signals 1880 from the base station 1840 to the remote units 1820, 1830, and 1850 and reverse link signals 1890 from the remote units 1820, 1830, and 1850 to base stations 1840.

In FIG. 18, remote unit 1820 is shown as a mobile telephone, remote unit 1830 is shown as a portable computer, and remote unit 1850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 18 illustrates remote units according to the aspects of the disclosure, the disclosure is not limited to these exemplary illustrated units. Aspects of the disclosure may be suitably employed in many devices, which include the disclosed transistors, FinFETs, or other structures within the scope of the present disclosure.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM memory, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A multiple time programmable (MTP) device, comprising:
   a substrate including a shallow trench isolation (STI) layer;
   a fin having a first wall, a second wall, and a surface connecting the first wall and the second wall, the first wall and the second wall adjoining the STI layer of the substrate;
   a floating gate dielectric having a first dielectric surface on the first wall of the fin, a second dielectric surface on the surface of the fin, and a third dielectric surface on the second wall of the fin;
   a dielectric spacer on the first dielectric surface and the second dielectric surface of the floating gate dielectric;
   a floating gate on the floating gate dielectric and the dielectric spacer;
   a coupling film in which an entire length of the coupling film is on an entire length of the floating gate; and
   a coupling gate on the entire length of the coupling film and at least a portion of the coupling gate directly coupled to the STI layer of the substrate.

2. The MTP device of claim 1, in which the floating gate is directly coupled to the floating gate dielectric on the second dielectric surface.

3. The MTP device of claim 1, in which the coupling film and coupling gate partially surround the floating gate.

4. The MTP device of claim 1, in which the floating gate comprises an input/output (I/O) device and, the floating gate dielectric comprises a thickness-adjustable oxide.

5. The MTP device of claim 1, in which the floating gate dielectric has a dielectric constant greater than a dielectric constant of silicon oxide.

6. The MTP device of claim 1, further comprising an erase dielectric coupled to the floating gate.

7. The MTP device of claim 1, integrated into a mobile phone, a set top box, a music player, a video player, an entertainment unit, a navigation device, a computer, a hand-held personal communication systems (PCS) unit, a portable data unit, and/or a fixed location data unit.

* * * * *